United States Patent
Yoon et al.

(10) Patent No.: US 12,188,121 B2
(45) Date of Patent: *Jan. 7, 2025

(54) METHOD OF DEPOSITING SILICON OXIDE FILMS

(71) Applicant: ASM Korea Ltd., Gyeonggi-do (KR)

(72) Inventors: Tae Ho Yoon, Anseong-si (KR); Hyung Sang Park, Seoul-si (KR); Yong Min Yoo, Cheonan-si (KR)

(73) Assignee: ASM Genitech Korea Ltd., Hwaseong-Si (KR)

(*) Notice: Subject to any disclaimer, the term of this patent is extended or adjusted under 35 U.S.C. 154(b) by 332 days.

This patent is subject to a terminal disclaimer.

(21) Appl. No.: 17/583,544

(22) Filed: Jan. 25, 2022

(65) Prior Publication Data

US 2022/0145452 A1 May 12, 2022

Related U.S. Application Data

(63) Continuation of application No. 16/822,390, filed on Mar. 18, 2020, now Pat. No. 11,261,523, which is a
(Continued)

(30) Foreign Application Priority Data

Aug. 10, 2007 (KR) .................. 10-2007-0080581

(51) Int. Cl.
*C23C 16/40* (2006.01)
*C01B 33/113* (2006.01)
(Continued)

(52) U.S. Cl.
CPC .......... *C23C 16/402* (2013.01); *C01B 33/113* (2013.01); *C04B 35/14* (2013.01);
(Continued)

(58) Field of Classification Search
CPC ............... C23C 16/401; C23C 16/402; C23C 16/45536–45542; H01L 21/02126–0214; H01L 21/02164; H01L 21/76–765
See application file for complete search history.

(56) References Cited

U.S. PATENT DOCUMENTS

| 3,424,661 A | 1/1969 | Androshuk et al. |
| 6,093,618 A | 7/2000 | Chen et al. |
| (Continued) | | |

FOREIGN PATENT DOCUMENTS

| KR | 100623594 | 9/2006 |
| KR | 101025731 | 4/2011 |
| WO | WO 2006/097525 | 9/2006 |

OTHER PUBLICATIONS

20a-ZC-1, Miyamoto et al., "High-Fluidity Deposition of SiN by Cryogenic Remote Plasma CVD," Research Center for Integrated Systems and Faculty of Engineering, Hiroshima University, 1 page.
(Continued)

*Primary Examiner* — Bryan R Junge
(74) *Attorney, Agent, or Firm* — Snell & Wilmer L.L.P.

(57) ABSTRACT

Methods of depositing a silicon oxide film are disclosed. One embodiment is a plasma enhanced atomic layer deposition (PEALD) process that includes supplying a vapor phase silicon precursor, such as a diaminosilane compound, to a substrate, and supplying oxygen plasma to the substrate. Another embodiment is a pulsed hybrid method between atomic layer deposition (ALD) and chemical vapor deposition (CVD). In the other embodiment, a vapor phase silicon precursor, such as a diaminosilane compound, is supplied to a substrate while ozone gas is continuously or discontinuously supplied to the substrate.

25 Claims, 5 Drawing Sheets

Related U.S. Application Data continuation of application No. 12/178,300, filed on Jul. 23, 2008, now abandoned.

(51) Int. Cl.

| | |
|---|---|
| *C04B 35/14* | (2006.01) |
| *C23C 16/44* | (2006.01) |
| *C23C 16/455* | (2006.01) |
| *H01L 21/02* | (2006.01) |
| *H01L 21/762* | (2006.01) |
| *H01L 23/535* | (2006.01) |
| *H01L 23/64* | (2006.01) |

(52) U.S. Cl.
CPC ........ *C23C 16/401* (2013.01); *C23C 16/4408* (2013.01); *C23C 16/45542* (2013.01); *H01L 21/02164* (2013.01); *H01L 21/02274* (2013.01); *H01L 21/76229* (2013.01); *H01L 23/535* (2013.01); *H01L 23/647* (2013.01); *Y10T 428/31504* (2015.04)

(56) References Cited

U.S. PATENT DOCUMENTS

| | | | |
|---|---|---|---|
| 6,100,160 | A | 8/2000 | Hames |
| 6,391,803 | B1* | 5/2002 | Kim .................. H01L 21/02222 |
| | | | 427/255.393 |
| 6,511,539 | B1 | 1/2003 | Raaijmakers |
| 6,539,891 | B1 | 4/2003 | Lee et al. |
| 6,542,277 | B2 | 4/2003 | Lange et al. |
| 6,645,574 | B1 | 11/2003 | Lee et al. |
| 6,861,334 | B2 | 3/2005 | Raaijmakers et al. |
| 6,930,018 | B2 | 8/2005 | Mehrad et al. |
| 7,410,671 | B2 | 8/2008 | Sherman |
| 8,022,442 | B2 | 9/2011 | Ookura |
| 11,261,523 | B2* | 3/2022 | Yoon ..................... C23C 16/402 |
| 2003/0188682 | A1 | 10/2003 | Tois et al. |
| 2004/0065253 | A1 | 4/2004 | Tois et al. |
| 2004/0115898 | A1 | 6/2004 | Moghadam et al. |
| 2005/0019494 | A1* | 1/2005 | Moghadam ....... C23C 16/45542 |
| | | | 204/192.15 |
| 2005/0034664 | A1 | 2/2005 | Koh et al. |
| 2005/0223982 | A1 | 10/2005 | Park et al. |
| 2006/0223280 | A1 | 10/2006 | Ueda |
| 2006/0249077 | A1 | 11/2006 | Kim et al. |
| 2007/0026540 | A1 | 2/2007 | Nooten et al. |
| 2007/0066083 | A1 | 3/2007 | Yang et al. |
| 2007/0163488 | A1 | 7/2007 | Tois et al. |
| 2007/0215036 | A1 | 9/2007 | Park et al. |
| 2007/0238310 | A1 | 10/2007 | Matsuda et al. |
| 2007/0251444 | A1* | 11/2007 | Gros-Jean ............ C23C 16/515 |
| | | | 117/951 |
| 2007/0287261 | A1 | 12/2007 | Raaijmakers et al. |
| 2008/0081104 | A1 | 4/2008 | Hasebe et al. |
| 2008/0241384 | A1 | 10/2008 | Jeong et al. |
| 2008/0308898 | A1 | 12/2008 | Gabric et al. |
| 2011/0262642 | A1* | 10/2011 | Xiao .................. H01L 21/02271 |
| | | | 427/255.394 |

OTHER PUBLICATIONS

20a-ZC-2, Gotou et al., "Atomic-Layer Deposition of SiN by Remote Plasma CVD," Research Center for Integrated Systems, Hiroshima University, 2 pages.

20a-ZC-3, Nakamura et al., "Atomic-Layer Deposition of SiO2 by Remote Plasma CVD," Research Center for Integrated Systems, Hiroshima University, 1 page.

http://www.filmetrics.com/refractive-index-database/SIO2/Fused-Silica-Silica-Silicon-Dioxide-Thermal-Oxide-ThermalOxide, referred to as Filmetrics, accessed online Mar. 2, 2015.

Kim et al., "TaN Films by Plasma Injection MO-ALD", ALD Conference 2004, Helsinki, Finland, Aug. 18, 2004, p. 1.

Kim et al., "TaN Films by Plasma Injection MO-ALD", ALD Conference 2004, Helsinki, Finland, Aug. 18, 2004, pp. 1-16.

Ma et al., "Plasma enhanced atomic layer deposition of TaN films for advanced interconnects", ECS Transactions 33 (2), 2010, pp. 169-176.

Niskanen, Antti, "Radical Enhanced Atomic Layer Deposition of Metals and Oxides", Laboratory of Inorganic Chemistry, Department of Chemistry, Faculty of Science, University of Helsinki, Finland, 2006, pp. 1-77.

* cited by examiner

METHOD OF DEPOSITING SILICON OXIDE FILMS

CROSS-REFERENCE TO RELATED APPLICATIONS

This application is a continuation of U.S. application Ser. No. 16/822,390, filed Mar. 18, 2020, which is a continuation of U.S. application Ser. No. 12/178,300, filed Jul. 23, 2008, now abandoned, and claims priority under 35 U.S.C. § 119(a) to and the benefit of Korean Patent Application No. 10-2007-0080581 filed in the Korean Intellectual Property Office on Aug. 10, 2007, the entire disclosures of which are incorporated herein by reference.

BACKGROUND OF THE INVENTION

Field of the Invention

The present invention relates to deposition of thin films. More particularly, the present invention relates to a method of depositing silicon oxide films.

Description of the Related Art

In depositing silicon oxide films for semiconductor devices, chemical vapor deposition (CVD) methods, such as low pressure CVD (LPCVD), atmospheric pressure CVD (APCVD), and plasma-enhanced CVD (PECVD), have been widely used. In LPCVD or APCVD, two or more source gases can be simultaneously supplied and deposited at a relatively high temperature (for example, about 500° C. to about 850° C.) to form a silicon oxide film over a substrate. In PECVD, a mixture of a vapor-phase precursor and a reactant gas can be activated by plasma to form a silicon oxide film.

Silicon oxide films deposited by a high temperature CVD process, such as LPCVD or APCVD, tend to have defects, such as interface oxidation and dopant diffusion. Such defects may degrade electrical characteristics of devices that include the silicon oxide films. Silicon oxide films deposited by a PECVD process may include about 2 atomic % to about 9 atomic % of hydrogen and nitrogen atoms. Such hydrogen and nitrogen atoms in the films may adversely affect the processing of the films, and result in a deviated refractive index (RI) and inconsistent etch selectivity.

Recently, the circuit density of semiconductor devices has been increased while the geometry of circuits has been decreased. In addition, aspect ratios of features in semiconductor devices have been increased. Accordingly, there is a need for a method of depositing silicon oxide films having enhanced step coverage over features of high aspect ratios, particularly for films that are thin and/or uniformly thick.

The above information disclosed in this Background section is only for enhancement of understanding of the background of the invention, and does not constitute prior art.

SUMMARY OF THE INVENTION

According to one embodiment, a method of depositing a silicon oxide film over a substrate is provided. The method includes one or more of deposition cycles. Each of the cycles includes: supplying a plurality of pulses of silicon source gas of a compound represented by Formula 1 into a reactor in which a substrate is loaded.

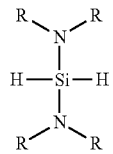

Formula 1

R is a straight or branched alkyl group having 1 to 4 carbons. The method also includes providing an oxygen-containing gas over the substrate in the reactor.

According to another embodiment, an apparatus includes a silicon oxide film made by the method described above. The silicon oxide film has an atomic ratio of silicon to oxygen of about 1:1, and the silicon oxide film has a refractive index between about 1.459 and about 1.483.

According to yet another embodiment, a method of forming a thin film over a substrate is provided. The method includes a first cycle which comprises: supplying a vapor phase silicon precursor comprising diaminosilane over a substrate; purging the vapor phase silicon precursor from the substrate; and supplying ozone gas to the substrate during supplying the vapor phase silicon precursor and after purging and before a subsequent cycle.

According to yet another embodiment, a method of depositing a thin film over a substrate is provided. The method includes supplying a silicon source gas to a substrate; and supplying an excited oxygen species to the substrate to form a film, such that the film has an atomic ratio of Si to O of about 0.5:1 to about 1.1:1.

DETAILED DESCRIPTION OF THE PREFERRED EMBODIMENT

The present invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

Figure 1:
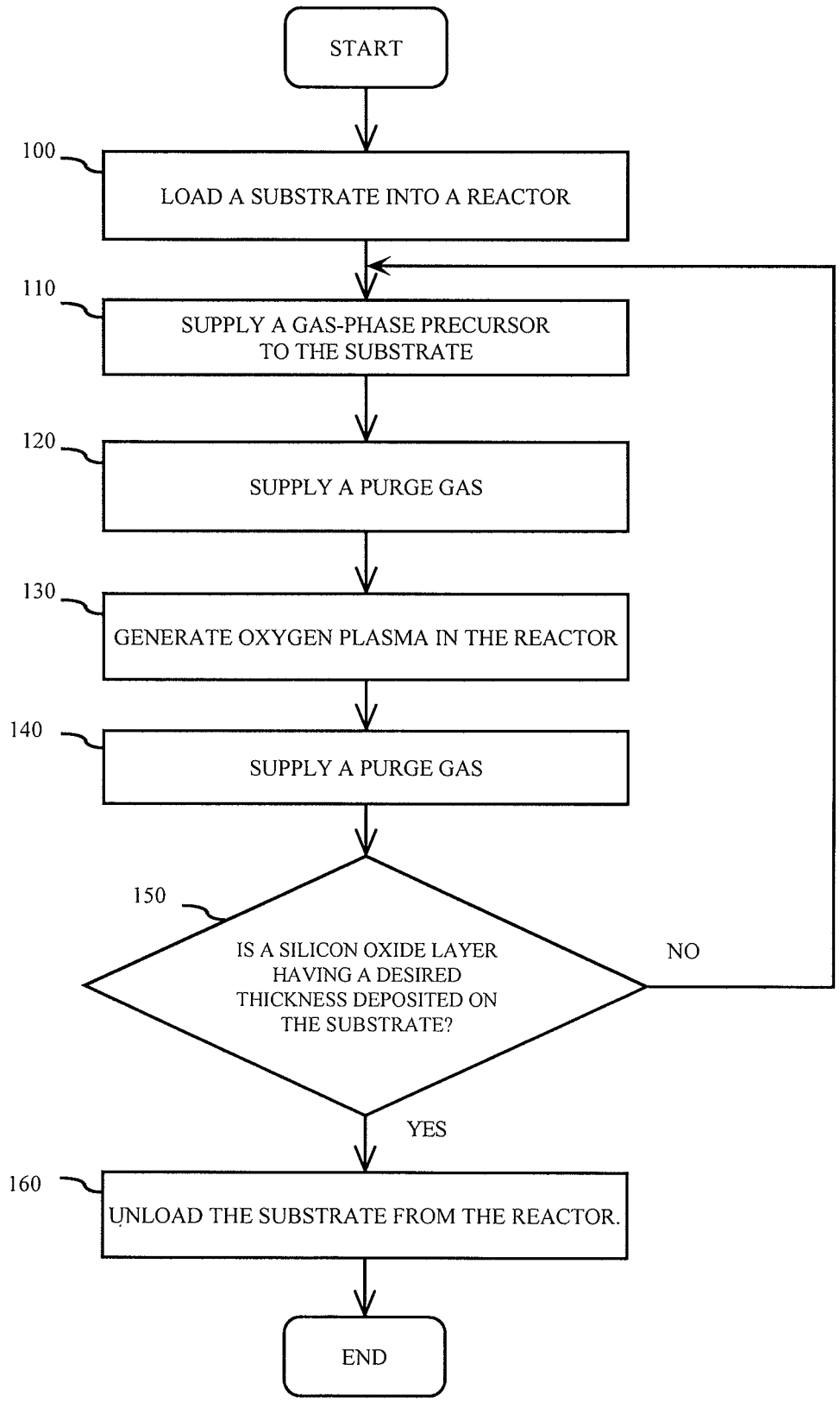
FIG. 1 is a flowchart illustrating a method of depositing a silicon oxide film according to a first embodiment.

A method of depositing a silicon oxide film according to a first embodiment will be described with reference to FIG. 1. FIG. 1 is a flowchart illustrating a cyclical method of depositing a silicon oxide film.

First, a substrate on which a silicon oxide film is to be deposited is loaded into a reactor (step 100). In one embodiment, the substrate may be a wafer formed of silicon. In other embodiments, the substrate may be formed of any other suitable material. The substrate may include one or more layers or features (for example, lines, islands, trenches, etc.) formed thereon.

In one embodiment, the reactor may be a chemical vapor deposition (CVD) reactor. In another embodiment, the reactor may be an atomic layer deposition (ALD) reactor. Examples of reactors include, but are not limited to, those described in U.S. Pat. Nos. 6,539,891; 6,645,574; U.S. Patent Application Publication No. 2005/0034664; U.S. Patent Application Publication No. 2006/0249077; and U.S. Patent Application Publication No. 2007/0215036, the disclosures of which are incorporated herein by reference in their entireties. ALD reactors are optimized for fast switching among purge gases and reactant gases, and to keep mutually reactive reactants separate from one another in the gas phase. A skilled artisan will appreciate that any suitable reactor may be adapted for the method.

Next, a gas-phase precursor is supplied over the substrate (step 110) in the reactor. In one embodiment, the precursor may include a diaminosilane compound represented by Formula 1 below.

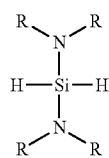

Formula 1

In Formula 1, R is a straight or branched alkyl group having 1 to 4 carbons (R=$C_nH_{2n+1}$; n is an integer of 1 to 4). In one embodiment, the precursor may be N,N,N',N'-tetraethyldiaminosilane which can be represented by the chemical formula, $SiH_2[N(C_2H_5)_2]_2$. The precursor may be supplied at a vapor pressure of about 2 torr at room temperature.

Next, a purge gas, such as Ar, is supplied (step 120) into the reactor to purge the reactor. A skilled artisan will appreciate that any suitable inert gas can be supplied as a purge gas, and that the purge gas supply can be the continuous supply of the same inert gas used as a carrier gas in the previous precursor supply 110.

Subsequently, oxygen plasma is generated in-situ in the reactor (step 130). In one embodiment, oxygen gas may be supplied to the reactor substantially continuously throughout the process described herein. In another embodiment, oxygen gas may be supplied to the reactor only at the step 130. The plasma may be generated by applying plasma power (for example, radio frequency power) to a capacitive coupling electrode positioned in the reactor. The plasma power may have a frequency of about 13.56 MHz or about 27.12 MHz. In other embodiments, oxygen plasma may be generated remotely and products of the plasma (e.g., excited oxygen species or radicals) supplied to the reactor.

After generating the oxygen plasma (step 130), a purge gas, such as Ar, is supplied (step 140) into the reactor. The purge gas supplied at the step 140 may be the same as the purge gas supplied at the step 120, which may also serve as carrier gases during the reactant pulses 110, 130. A skilled artisan will appreciate that any suitable inert gas can be supplied as a purge gas. In certain embodiments, the step 140 may be omitted, particularly where the active oxygen species of step 130 quickly die off after stopping the plasma power supply.

The steps 110-140 described above may form a cycle, which may be repeated until a silicon oxide film having a desired thickness is deposited on the substrate (decision box 150). In one embodiment, this process can be performed at a process temperature between about 50° C. and about 450° C. and under a process pressure of about 0.1 torr to about 10 torr. In one embodiment, oxygen ($O_2$) gas may have a gas flow rate between about 50 sccm and about 300 sccm. The plasma power applied to the reactor for in situ plasma generation may be between about 50 W and about 700 W, or between about 0.05 W/cm$^2$ and about 2 W/cm$^2$.

In Example 1, a silicon oxide film was deposited by a deposition method according to the first embodiment. The process temperature was about 350° C., and the process pressure was about 1.5 torr. The oxygen ($O_2$) flow rate was about 50 sccm, and plasma power applied was about 200 W.

Figure 2:
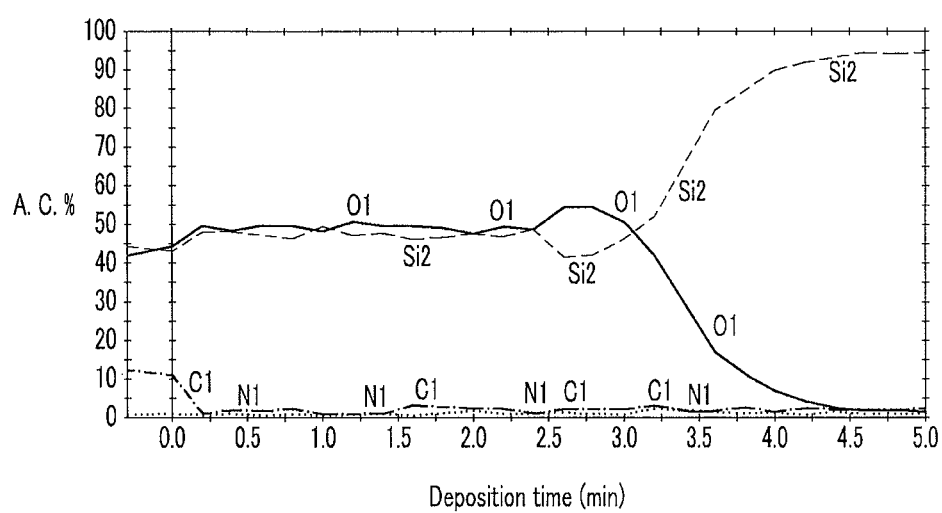
FIG. 2 is a graph illustrating the atomic emission spectroscopy (AES) analysis results of a silicon oxide film deposited by a method according to the first embodiment.

FIG. 2 is a depth profile graph representing atomic emission spectroscopy (AES) analysis results of the silicon oxide film. The silicon oxide film was found to have an atomic ratio of silicon (Si) to oxygen (O) of about 1:1. The silicon oxide film included less than 3 atomic % of impurities, such as carbon (C) atoms and nitrogen (N) atoms. In other words, a silicon-rich silicon oxide film was formed by the deposition method. The silicon-rich silicon oxide film according to embodiments described herein may have an atomic ratio of silicon (Si) to oxygen (O) of about 0.5:1 to about 1.1:1, or optionally about 0.55:1 to about 1.1:1.

Figure 3:
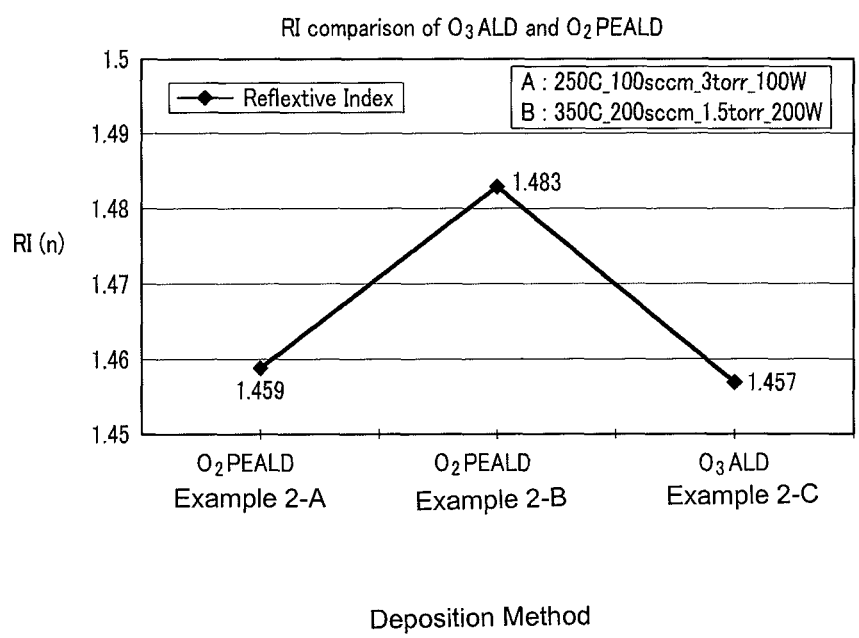
FIG. 3 is a graph illustrating the refractive indices (RI) of silicon oxide films formed by deposition methods according to the first embodiment and other methods for comparison

Referring to FIG. 3, the refractive indices (RI) of silicon oxide films formed by deposition methods will be described below. In Examples 2-A and 2-B, silicon oxide films were formed by methods according to the first embodiment under different conditions. In Example 2-C, a silicon oxide film was formed by thermal ALD methods.

In Example 2-A, a first silicon oxide film was deposited using $SiH_2[N(C_2H_5)_2]_2$ at a process temperature of about 250° C. and a process pressure of about 3 Torr with an oxygen ($O_2$) flow rate of about 100 sccm and applied plasma power of about 100 W. In Example 2-B, a second silicon oxide film was deposited using $SiH_2[N(C_2H_5)_2]_2$ at a process temperature of about 350° C. and a process pressure of about 1.5 torr with an oxygen ($O_2$) flow rate of about 200 sccm and plasma power of about 200 W. The second silicon oxide film deposited in Example 2-B had substantially the same thickness as the first silicon oxide film deposited in Example 2-A. In addition, a third silicon oxide film having substantially the same thickness as the silicon oxide films of Examples 2-A and 2-B was deposited by thermal atomic layer deposition (ALD), using $SiH_2[N(C_2H_5)_2]_2$ and ozone ($O_3$) as reactants. The third silicon oxide film was deposited at a process temperature of about 300° C. and a process pressure of about 1.0 torr, while ozone was supplied at a flow rate of about 100 sccm.

The refractive indices (RI) of the first to third silicon oxide films were measured, and the results are shown in FIG. 3. The first silicon oxide film in Example 2-A was found to have an RI of about 1.459. The second silicon oxide film in Example 2-B was found to have an RI of about 1.483. The third silicon oxide film deposited by the thermal ALD method was found to have an RI of about 1.457. Thus, the silicon oxide films in Examples 2-A and 2-B had RI greater than the silicon oxide film deposited by the thermal ALD method.

The silicon oxide films may have various RI values, depending on the plasma process conditions. However, the greater RI value is, the slower is the etch rate of the silicon oxide film. In one embodiment, a silicon oxide film having a relatively high RI value may be used as a liner insulation film used for formation of a shallow trench isolation (STI) structure in a semiconductor device. In such an embodiment, the silicon oxide film having a high RI value may prevent a moat from being produced at the edge of the STI structure during a wet etching process, since silicon-rich silicon oxide film is not wet-etched well.

In the first embodiment described above, N,N,N',N'-tetraethyldiaminosilane ($SiH_2[N(C_2H_5)_2]_2$) may be used as a silicon precursor. N,N,N',N'-tetraethyldiaminosilane ($SiH_2[N(C_2H_5)_2]_2$) has good deposition characteristics at a temperature between about 50° C. and about 450° C. Thus, deposition can be performed in a relatively wide temperature range with a relatively small amount of the precursor. In addition, N,N,N',N'-tetraethyldiaminosilane has good thermal stability at a high process temperature (for example, about 350° C.) when used in the plasma enhanced atomic deposition method (PEALD) according to the first embodiment. Good thermal stability is important for self-limited behavior (and thus thickness uniformity) in ALD methods, so that the precursor self-limitingly adsorbs rather than decomposing during the silicon precursor pulse. Furthermore, a silicon oxide film having a desired atomic ratio may be formed, using the precursor.

In addition, the deposition method according to the first embodiment forms a silicon oxide film having good step coverage while providing a thin and/or uniform thickness over features having a high aspect ratio.

Figure 4:
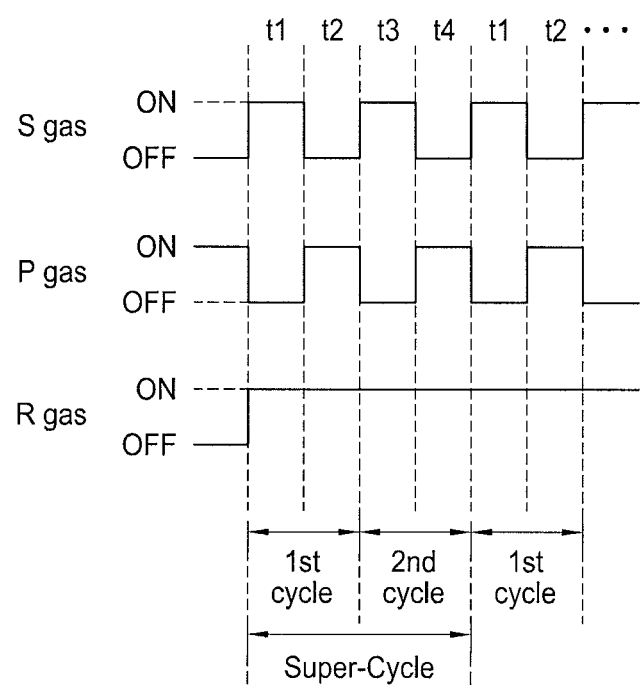
FIG. 4 is a timing diagram illustrating a method of depositing a silicon oxide film according to a second embodiment.

Referring to FIG. 4, a method of depositing a silicon oxide film according to a second embodiment will be described below. FIG. 4 illustrates gas supply cycles for the method.

In the illustrated method, a substrate on which a silicon oxide film is to be deposited is loaded into a reactor. The details of the substrate can be as described above with respect to the substrate of FIG. 1. In one embodiment, the reactor may be a chemical vapor deposition (CVD) reactor. In another embodiment, the reactor may be an atomic layer deposition (ALD) reactor. Examples of reactors include, but are not limited to, those described in U.S. patent application Ser. No. 12/058,364, filed on Mar. 28, 2008, entitled LATERAL FLOW DEPOSITION APPARATUS AND METHOD OF DEPOSITING FILM BY USING THE APPARATUS, the disclosure of which is incorporated herein by reference in its entirety for purposes of describing a suitable reactor for implementing the second embodiment.

Then, a reactant gas R, such as ozone ($O_3$), is substantially continuously supplied over the substrate in the reactor for a first time period t1 and a second time period t2 in a first direction relative to the orientation of the substrate. During the first time period t1, while supplying the reactant gas R, a silicon source gas S is also supplied over the substrate in the first direction. The silicon source gas S may include a diaminosilane compound represented by Formula 1 above. In one embodiment, the silicon source gas S may be N,N,N',N'-tetraethyldiaminosilane ($SiH_2[N(C_2H_5)_2]_2$).

During the second time period t2, the supply of the silicon source gas is stopped, the reactant R flow continues and a purge gas P is supplied to the reactor in the first direction. The second time period t2 may be shorter than the first time period t1. In certain embodiments, the second time period t2 may be omitted. The steps performed during the first and second time periods t1, t2 form a first cycle, which can be repeated one or more times.

The reactant gas R, such as ozone ($O_3$), continues to be supplied to the reactor for a third time period t3 and a fourth time period t4. During these periods, the reactant gas R may be supplied over the substrate in a second direction relative to the orientation of the substrate. The second direction may be substantially different from the first direction. In one embodiment, the second direction is generally opposite from the first direction. In another embodiment, the first and second directions may be substantially perpendicular to each other. A skilled artisan will appreciate that an angle between the first and second directions can vary widely, depending on the deposition methods.

During the third time period t3, while supplying the reactant gas R, a silicon source gas S is supplied over the substrate in the second direction. Subsequently, during the fourth time period t4, a purge gas P is supplied to the reactor in the second direction. The steps performed during the third and fourth time periods t3, t4 form a second cycle, which can be repeated one or more times. One or more of first cycles and one or more of second cycles can form a super-cycle, which can be repeated until a silicon oxide film having a desired thickness is formed on the substrate.

In some embodiments, a super-cycle may include one or more of third cycles during which gases are supplied over the substrate in a third direction that is different from the first and second directions. In other embodiments, a super-cycle may include additional cycles during which gases are supplied over the substrate in directions that are different from the first to third directions. Changing directions of flow, relative to the substrate, in a regular manner, allows averaging out any spatial non-uniformities, such as depletion effects and by-product interference with downstream deposition, thus improving thickness and compositional non-uniformity. The different directions can be accomplished by incremental rotation of the substrate or moving the substrate among multiple deposition zones into different orientations relative to the gas flow directions. Examples of changing directions of flow are described in detail in U.S. patent application Ser. No. 12/058,364, the disclosure of which is incorporated herein by reference in its entirety.

In one embodiment, the method can be performed at a process temperature between room temperature and about 400° C., optionally between about 200° C. and about 350° C. The method can be performed under a process pressure between about 0.1 torr and about 10 torr, optionally between about 1.5 torr and about 3 torr. The reactant gas R, such as ozone ($O_3$), may be supplied at a gas flow rate between about 50 sccm and about 1000 sccm, optionally between about 250 sccm and about 1000 sccm.

In the illustrated method, the reactant gas R is substantially continuously supplied to the reactor during one or more super-cycles. During the super-cycles, at least a portion of the reactant gas R is adsorbed on the surface of the substrate while additional reactant gas R may remain in the reactor. In addition, at least a portion of the source gas S supplied during the first time period t1 and the third time period t3 is adsorbed on the surface of the substrate while the remainder of the supplied source gas S may remain in the reactor in vapor phase.

During the first time period t1 and/or the third time period t3, the remainders of the source gas S and the reactant gas R react with each other to form a silicon oxide film by chemical vapor deposition reactions. Further, during the first time period t1 and the third time period t3, the source gas S adsorbed on the surface of the substrate reacts chemically with the reactant gas R on the heated surface of the substrate during the second time period t2 and the fourth time period t4, and forms a silicon oxide film by atomic layer deposition reactions. In the illustrated embodiment, either or both of reaction of simultaneously supplied vapor phase reactants (CVD) and a surface reaction of separately supplied reactants (ALD) may occur during each cycle to form a silicon oxide film, thereby increasing the deposition rate.

In addition, the deposition method includes supplying the source gas S and the reactant gas R in different directions relative to the orientation of the substrate. As described above, the deposition method includes the gas supplying time periods t1 and t2 during which the source gas S, the reactant gas R, purge gas P are supplied in the first direction, relative to the substrate. The method also includes the gas supplying time period t3 and t4 during which the source gas S, the reactant gas R, and purge gas P are supplied in the second direction different from the first direction, relative to the substrate. This configuration can increase the thickness uniformity of a silicon oxide film. In certain embodiments where a lateral flow deposition method is used, the embodiment can substantially improve the thickness uniformity of a silicon oxide film by averaging out any spatial non-uniformities due to the CVD component of the reactions.

Examples of deposition methods according to the embodiments described above will be described. In Example 3, deposition was conducted according to the second embodiment described above with reference to FIG. 4. In Example 3, a gas supplying method included repeating the first and second cycles described above with reference to FIG. 4. In Example 3, each gas supplying super-cycle t1 to t4 included flowing gases in a first gas flow direction during t1 and t2 and in a second gas flow direction during t3 and t4. The second gas flow direction was opposite to the first gas flow direction, relative to the substrate.

In Example 4, deposition was conducted according to the first embodiment described above with reference to FIG. 1. In Example 4, a gas supplying method included flowing gases only in a single flow direction relative to the orientation of a substrate.

In Example 5, deposition was conducted by repeating supplying a source gas, a purge gas, a reactant gas, and a purge gas alternately in separated pulses of a conventional ALD method. In Examples 3-5, deposition conditions were the same as one another except for the gas supplying methods.

In Examples 3 and 5, the deposition rates of the silicon oxide films were measured, and the results are shown in Table 1.

TABLE 1

| | Deposition Rate (Å/cycle) |
|---|---|
| Example 3 | 2.5 |
| Example 5 | 1.1 |

Table 1 shows that the silicon oxide film of Example 3 was deposited at a higher deposition rate than that of Example 5. The deposition rate of Example 3 was more than twice greater than that of Example 5.

Figure 5:
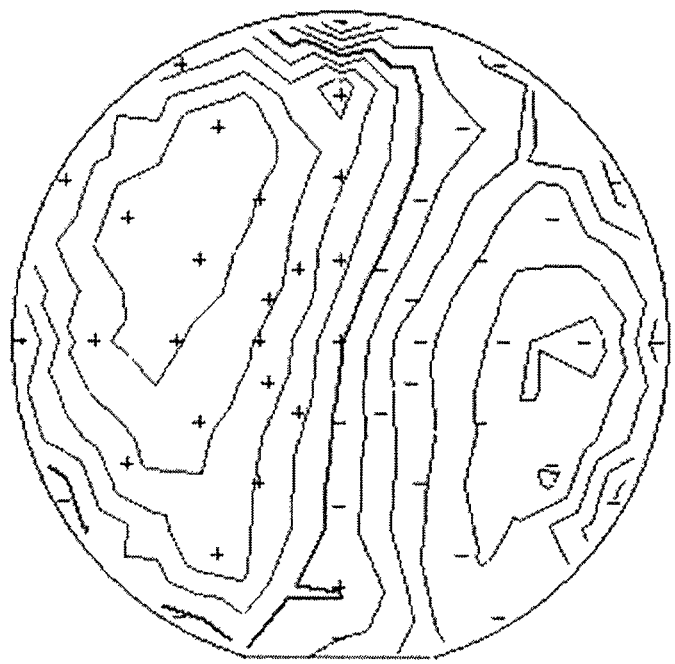
FIG. 5 is a wafer map illustrating uniformity of a silicon oxide film deposited by a method according to the second embodiment.
Figure 6:
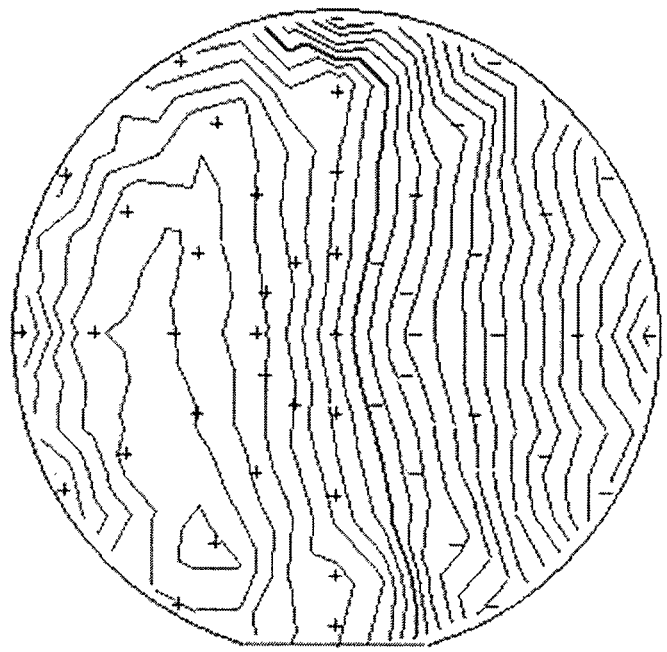
FIG. 6 is a wafer map illustrating the thickness uniformity of a silicon oxide film deposited by a method according to the first embodiment.

In Examples 3 and 4, the thickness uniformities of the silicon oxide films were measured, and the results are shown in FIGS. 5 and 6, respectively. The thicknesses of the silicon oxide films were measured at 49 points on the top surfaces of the substrates by ellipsometry.

In Example 3, the average thickness of the silicon oxide film was about 228 Å and the deviation (high/low variance) of the thickness was about 5.76%. The standard deviation was 3.25%. In Example 4, the average thickness of the silicon oxide film was about 155 Å and the deviation (high/low variance) of the thickness was about 13.83%. The standard deviation was 6.93%. These results show that the silicon oxide film of Example 3 has a more uniform thickness and a higher deposition rate than that of the silicon oxide film of Example 4.

Although embodiments and examples have been described, the present invention is not limited to the embodiments and examples, but may be modified in various forms without departing from the scope of the appended claims, the detailed description, and the accompanying drawings of the present invention. Therefore, it is natural that such modifications belong to the scope of the present invention.

What is claimed is:

1. A method of forming a shallow trench isolation structure comprising a liner layer, wherein the liner layer comprises a silicon oxide film having a refractive index (RI) from 1.457 to 1.483, and wherein the silicon oxide film was made by a plasma enhanced atomic layer deposition (PEALD) process.

2. The method of claim 1, wherein the silicon oxide film comprises less than 3 atomic % of impurities.

3. The method of claim 2, wherein the impurities comprise carbon (C) atoms and nitrogen (N) atoms.

4. The method of claim 1, wherein the PEALD process comprises a plurality of deposition cycles comprising separately contacting a substrate in a reaction space with a silicon precursor comprising N,N,N',N'-tetraethyldiaminosilane ($SiH_2[N(C_2H_5)_2]_2$) and an oxygen plasma.

5. The method of claim 4, wherein the oxygen plasma is generated over the substrate in the reaction space.

6. The method of claim 1, wherein the silicon oxide film has an RI of about 1.459.

7. The method of claim 1, wherein the silicon oxide film has an RI of about 1.483.

8. The method of claim 1, wherein the silicon oxide film has an atomic ratio of silicon to oxygen of about 0.5:1 to about 1.1:1.

9. A method of forming a shallow trench isolation (STI) structure in a semiconductor device comprising depositing a silicon oxide film having a refractive index (RI) from 1.457 to 1.483 on a substrate by a plasma enhanced atomic layer deposition (PEALD) process comprising a plurality of deposition cycles comprising separately contacting the substrate in a reaction space with a silicon source gas and an oxygen plasma.

10. The method of claim 9, wherein the silicon source gas comprises a diaminosilane compound.

11. The method of claim 10, wherein the silicon oxide film is a liner layer in the STI structure.

12. The method of claim 9, wherein the silicon oxide film prevents a moat from being produced at an edge of the STI structure during a subsequent wet etch process.

13. The method of claim 9, wherein the silicon oxide film has an atomic ratio of silicon to oxygen of about 0.5:1 to about 1.1:1.

14. The method of claim 9, wherein the silicon oxide film comprises less than 3 atomic % of impurities.

15. The method of claim 14, wherein the impurities comprise carbon (C) atoms and nitrogen (N) atoms.

16. The method of claim 9, wherein the plurality of deposition cycles comprises supplying a purge gas into the reaction space after contacting the substrate with the silicon source gas and prior to contacting the substrate with the oxygen plasma.

17. The method of claim 16, wherein the plurality of deposition cycles comprises supplying a purge gas into the reaction space after contacting the substrate with the oxygen plasma.

18. The method of claim 9, wherein the silicon source gas comprises N,N,N',N'-tetraethyldiaminosilane (SiH$_2$[N(C$_2$H$_5$)$_2$]$_2$).

19. The method of claim 9, wherein the oxygen plasma is generated in an oxygen-containing gas over the substrate in the reaction space.

20. The method of claim 19, wherein the oxygen-containing gas is supplied continuously to the reaction space throughout the deposition cycle.

21. The method of claim 9, wherein the oxygen plasma is generated in an oxygen-containing gas by applying a plasma power of between 0.05 W/cm$^2$ and 2 W/cm$^2$.

22. The method of claim 9, wherein the oxygen plasma is generated in an oxygen-containing gas using a plasma power having a frequency of 13.56 MHz to 27.12 MHz.

23. The method of claim 9, wherein the PEALD process is carried out at a temperature between about 50° C. and about 450° C.

24. The method of claim 9, wherein the silicon oxide film has an RI of about 1.459.

25. The method of claim 9, wherein the silicon oxide film has an RI of about 1.483.

* * * * *